May 6, 1952 W. M. WEBSTER, JR 2,595,497

SEMICONDUCTOR DEVICE FOR TWO-STAGE AMPLIFIERS

Filed Jan. 22, 1949

INVENTOR
WILLIAM M. WEBSTER, JR.
BY H. L. Newton
ATTORNEY

Patented May 6, 1952 2,595,497

UNITED STATES PATENT OFFICE 2,595,497

SEMICONDUCTOR DEVICE FOR TWO-STAGE AMPLIFIERS

William M. Webster, Jr., Princeton, N. J., assignor to Radio Corporation of America, a corporation of Delaware Application January 22, 1949, Serial No. 72,153

13 Claims. (Cl. 175—366)

Figures 1, 2:
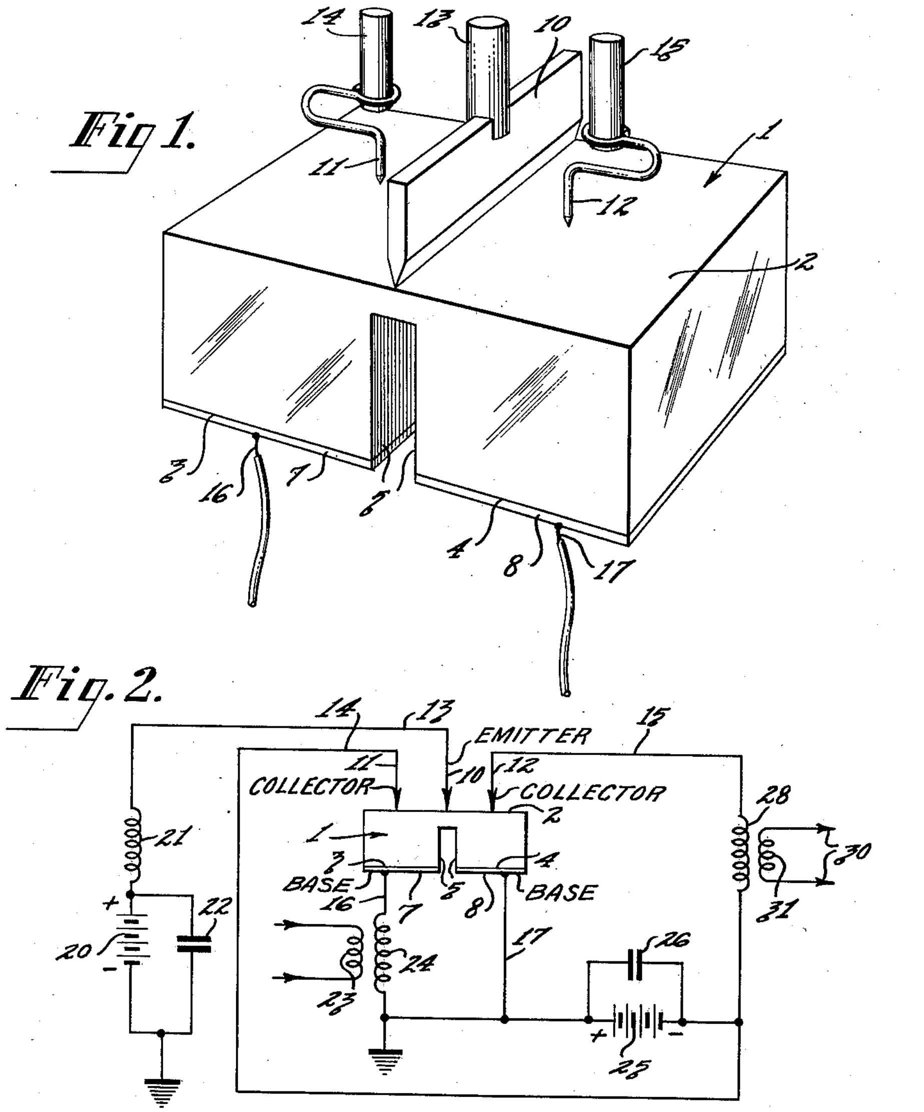

This invention relates to semi-conductor devices and particularly to a multi-electrode semi-conductor device which may find application as a two-stage cascade-connected amplifier.

The three-electrode semi-conductor is a recent development in the field of electronic amplification. This device is presently known as a "transistor," and its essential characteristics have been disclosed in a series of three letters to the Physical Review by Bardeen and Brattain, Brattain and Bardeen, and Shockley and Pearson which appear on pages 230 to 233 of the July 15, 1948, issue. The new amplifier device includes a block of a semi-conducting material such as silicon or germanium which is provided with two closely adjacent point electrodes called "emitter" and "collector" electrodes in contact with one surface region of the material, and a "base" electrode which provides a large-area, low-resistance contact with another surface region of the semi-conductor. The input circuit of the amplifier described in the publication referred to above is connected between the emitter electrode and the base electrode while the output circuit is connected between the collector electrode and the base electrode. In this circuit the base electrode is the common input and output electrode and may, therefore, be grounded.

It is also feasible to connect two or more semi-conductor amplifiers in cascade. A novel two-stage cascade-connected amplifier circuit has been disclosed and claimed in applicant's co-pending application filed concurrently herewith, Serial No. 72,152 and assigned to the assignee of this application. The semi-conductor device of the present invention may be utilized with advantage in the cascade amplifier circuit disclosed in the application referred to.

It is an object of the present invention, therefore, to provide a novel multi-electrode semi-conductor device.

A further object of the invention is to provide a single body of semi-conducting material with a plurality of electrodes whereby the resulting device may be utilized in a two-stage cascade-connected amplifier circuit.

A device in accordance with the present invention comprises a semi-conducting body having two surfaces electrically isolated from each other by a slot in the semi-conducting body. Two base electrodes are connected to these surfaces to provide individual large-area low-resistance contacts with the semi-conducting body. Another surface of the semi-conducting body is provided with a single emitter electrode which preferably extends across the entire width of the surface and is disposed opposite the slot. Two collector electrodes which preferably are point electrodes are disposed on opposite sides of the emitter electrode and are in contact with the same surface which the emitter electrode contacts. The resulting device may be utilized as a two-stage amplifier having a common emitter electrode. The slot in the semi-conducting body may be arranged so that the impedance between the two base electrodes is larger than the impedance between each base electrode and its associated collector electrode or than the impedance between the emitter electrode and any one of the base electrodes.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Fig. 1 is a view in perspective of a multi-electrode semi-conductor device embodying the present invention; and Fig. 2 is a circuit diagram of a two-stage amplifier utilizing the device of Fig. 1, the amplifier circuit of Fig. 2 being claimed in applicant's co-pending application above referred to.

Referring now to Fig. 1 there is illustrated an amplifier device including a block 1 of semi-conducting material which may consist, for example, of an electronic semi-conductor such as germanium or silicon containing a small but sufficient number of atomic impurity centers or lattice imperfections, as commonly employed for best results in crystal rectifiers and other semi-conducting devices. Germanium is the preferred material for block 1 and may be prepared so as to be an electronic N type semi-conductor. The surface of semi-conducting block 1 may be polished and etched in the manner disclosed in the paper by Bardeen and Brattain referred to above. It is also feasible to utilize the germanium block from a commercial high-back-voltage germanium rectifier such as the type 1N34. In this case further surface treatment may not be required.

As shown in Fig. 1, block 1 has a top surface 2 which is parallel with bottom surfaces 3 and 4 which are separated and electrically isolated from each other by a slot 5. Surfaces 3 and 4 may be disposed in the same plane as illustrated. Block 1 may, for example, be prepared by cutting slot 5 with a saw into a suitable block of semi-conducting material. Alternatively, two separate pieces of semi-conducting material may be joined together at the top to form the structure illustrated in the drawing. Instead of providing an open slot 5 in semi-conducting body 1, the slot may be filled with a suitable insulating material such as mica. The width of slot 5 may be of the order of a few mils, a mil being one thousandth of an inch.

Slot 5 accordingly forms a bifurcated base having surface areas 3 and 4 which are provided with base electrodes 7 and 8 to form two large-area low-resistance contacts with the two base portions of semi-conductor 1. A single emitter electrode 10 is in contact with the top surface 2 of semi-conductor 1. Emitter electrode 2 is of knife-edge shape and preferably extends across the entire width of surface 2. Emitter electrode 10 is disposed opposite slot 5 to provide an elongated small-area-contact with surface 2. Two collector electrodes 11 and 12 are disposed on opposite sides of emitter electrode 10 and are in contact with surface 2. Collector electrodes 11 and 12 are thus arranged opposite base electrodes 7 and 8 respectively.

Collector electrodes 11 and 12 preferably make point contact to surface 2 as illustrated in Fig. 1 and may consist, for example, of tungsten or phosphor-bronze wires having a diameter of the order of two to five mils. Collector electrodes 11, 12 are ordinarily placed closely adjacent to emitter electrode 10 from which they may be separated by a distance of from two to ten mils. The width of the knife edge of emitter electrode 10 at its line of contact with surface 2 may be of the order of a few mils.

Emitter electrode 10 and collector electrodes 11 and 12 may be connected respectively to heavy wires 13, 14 and 15 to which an electrical connection may be made. Base electrodes 7 and 8 may be connected to leads 16 and 17 respectively.

The presently accepted theory of operation of a semi-conductor amplifier has been explained in detail in applicant's copending application above referred to. Therefore, it is not deemed to be necessary to set forth the theory of operation of a semi-conductor amplifier herein as the present invention relates to a structural improvement for use in amplifier systems.

Slot 5 which effectively provides a bifurcated base for the semi-conducting body should be of such a depth that the impedance between base electrodes 7 and 8 is larger than the impedance between base electrodes 7, 8 and their associated collector electrodes 11, 12 or that between base electrodes 7, 8 and emitter electrode 10.

Fig. 2 illustrates, by way of example, a two-stage cascade-connected amplifier circuit in which the device of Fig. 1 may be used with advantage. The circuit of Fig. 2 has been claimed in applicant's copending application referred to. By means of a suitable source of potential such as battery 20, emitter electrode 10 may be biased in a relatively conducting polarity with respect to base electrodes 7 and 8. Accordingly, when the semi-conductor is of the N type the negative terminal of battery 20 should be grounded while its positive terminal is connected through choke coil 21 and lead 13 to emitter electrode 10. Battery 20 may be bypassed by bypass capacitor 22 for signal frequency currents. The input signal may be impressed on inductor 23 magnetically coupled to inductor 24 having one of its terminals grounded while the other terminal is connected through lead 16 to base electrode 7. Base electrode 8 is grounded through lead 17. Collector electrode 11 is biased with respect to base electrode 7 in a relatively non-conducting polarity by a suitable source of potential such as battery 25. Assuming that semi-conductor 1 is of the N type, the positive terminal of battery 25 is then grounded while its negative terminal is connected through lead 14 to collector electrode 11. Battery 25 may be bypassed for signal frequency currents by bypass capacitor 26. The negative terminal of battery 25 is also connected through load impedance 28 which may consist of an inductor, and through lead 15 to collector electrode 12. Accordingly, collector electrode 12 and base electrode 8 are biased in a relatively non-conducting polarity. The amplified output signal developed in output inductor 28 may be obtained from output terminals 30 connected across inductor 31 magnetically coupled to inductor 28.

The two-stage amplifier circuit of Fig. 2 has a power gain which is slightly higher than the combined power gain of its individual amplifier stages. The input signal is impressed effectively between base electrode 7 and collector electrode 11. The output signal of the first amplifier stage is derived effectively between emitter electrode 10 and collector electrode 11. Emitter electrode 10 simultaneously forms the input electrode of the second amplifier stage. The output signal of the second amplifier stage is derived effectively between collector electrode 12 and base electrode 17.

By means of slot 5 in semi-conductor body 1 and emitter electrode 10, the two amplifier stages are effectively isolated although body 1 may consist of a single coherent crystal.

There has thus been disclosed a multi-electrode semi-conductor device which may be utilized, for example, in a two-stage cascade-connected amplifier circuit. The device has put a single emitter electrode which is common to the two amplifier stages and utilizes a single body of semi-conducting material. The two amplifier stages are electrically isolated from each other by the common emitter electrode and by an isolating gap between the two base electrodes.

What is claimed is:

1. A device of the character described comprising a single semi-conducting body of substantially uniform electrical characteristics having a bifurcated base, and electrodes individual to the separate surface areas of said base.

2. A device adapted for use as an amplifier and comprising a single semi-conducting body of substantially uniform electrical characteristics having a bifurcated base, electrodes individual to the separate surface areas of said base, and further electrodes of relatively small area compared to that of said first mentioned electrodes provided on another surface area of said body.

3. A multi-electrode semi-conductor comprising a body of semi-conducting material having a bifurcated base, electrodes individual to the separate surface areas of said base, and at least three further electrodes of relatively small area compared to that of said first mentioned electrodes provided on another surface area of said body.

4. A device of the character described comprising a semi-conducting body, a first and a second electrode of relatively large area connected to said body, and a third electrode having an elongated relatively small contact area with said body.

5. A device of the character described comprising a semi-conducting body, a first and a second electrode of relatively large area in contact with said body, a third electrode having an elongated relatively small contact area with said body, and at least a further pair of electrodes connected to said body and disposed on opposite sides of said third electrode.

6. A device of the character described comprising a semi-conducting body, three electrodes of relatively small area, in contact with said body, and two further electrodes having a contact area with said body which is large compared to that of said three electrodes.

7. A device of the character described comprising a semi-conducting body having a first, a second and a third surface, a first and a second electrode connected individually to said first and second surfaces, a plurality of further electrodes provided on said third surface, said first and second electrodes having a contact area that is large compared to that of said further electrodes, said first and second surfaces being electrically isolated from each other so that the impedance between said first and second electrodes is larger than that between said first electrode and one of said further electrodes or that between said second electrode and one of said further electrodes.

8. A device of the character described comprising a single electronic semi-conducting body having a first, a second and a third surface, a first and a second electrode connected individually to said first and second surfaces, three further electrodes provided on said third surface, said first and second electrodes having a contact area that is large compared to that of said three further electrodes, said first and second surfaces being separated and electrically isolated from each other so that the impedance between said first and second electrodes is larger than that between said first electrode and one of said three further electrodes or that between said second electrode and one of said three further electrodes.

9. A device adapted for use as an amplifier and comprising a semi-conducting body having a first, a second and a third surface, said material having a slot therein separating said first and said second surface from each other, a first electrode and a second electrode provided respectively on said first and on said second surface, said first and second electrodes being of relatively large area, a third electrode having an elongated contact area with said third surface, said contact area being small compared to that of said first and second electrodes, and two further electrodes of relatively small area provided on said third surface on opposite sides of said third electrode.

10. A device adapted for use as an amplifier and comprising a semi-conducting body having a first, a second and a third surface, said material having a slot therein separating said first and said second surface from each other, a first base electrode and a second base electrode provided respectively on said first and on said second surface, said base electrode being of relatively large area, an emitter electrode having an elongated contact area with said third surface, said contact area being small compared to that of said base electrode, and two collector electrodes of relatively small area provided on said third surface on opposite sides of said emitter electrode.

11. A device adapted for use as a two-stage amplifier and comprising an electronic semi-conducting body having a first, a second and a third surface, said material having a slot therein separating said first and said second surface from each other, a first base electrode and a second base electrode provided respectively on said first and on said second surface, said base electrodes being of relatively large area, an emitter electrode having an elongated contact area with said third surface, said contact area being small compared to that of said base electrodes, said emitter electrode being provided substantially opposite said slot and extending substantially across the entire width of said third surface, and two collector electrodes of relatively small area provided on said third surface on opposite sides of said emitter electrode.

12. A device adapted for use as a two-stage amplifier and comprising an electronic semi-conducting material having a first, a second and a third surface, said material having a slot therein separating and insulating said first and said second surface from each other, said first and said second surface being arranged substantially in the same plane and being substantially parallel to said third surface, a first and a second base electrode provided respectively on said first and on said second surface, said base electrodes having a relatively large contact area with their associated surfaces, an emitter electrode provided on said third surface substantially opposite said slot, said emitter electrode having a relatively small and elongated contact area with said third surface, and a first and a second collector electrode provided on said third surface substantially opposite said first and second base electrodes respectively and on opposite sides of said emitter electrode, said collector electrodes having a substantially point-like contact area which is small compared to that of said base electrodes.

13. A device adapted for use as a two-stage amplifier and comprising an electronic semi-conducting material having a first, a second and a third surface, said material having a slot therein separating and insulating said first and said second surface from each other, said first and said second surface being arranged substantially in the same plane and being substantially parallel to said third surface, a first and a second base electrode provided respectively on said first and on said second surface, said base electrodes having a relatively large contact area with their associated surfaces, an emitter electrode provided on said third surface substantially opposite said slot, said emitter electrode having a relatively small and elongated contact area with said third surface extending substantially across the entire width of said third surface, and a first and a second collector electrode provided on said third surface substantially opposite said first and second base electrodes respectively and on opposite sides of said emitter electrode, said collector electrodes having a substantially point-like contact area which is small compared to that of said base electrodes.

WILLIAM M. WEBSTER, Jr.

REFERENCES CITED

The following references are of record in the file of this patent:

UNITED STATES PATENTS

| Number | Name | Date |
|---|---|---|
| 1,745,175 | Lilienfeld | Jan. 28, 1930 |
| 1,949,383 | Weber | Feb. 27, 1934 |
| 2,402,661 | Ohl | June 25, 1946 |